United States Patent
Khlat et al.

(10) Patent No.: US 11,671,064 B2
(45) Date of Patent: Jun. 6, 2023

(54) EQUALIZER FOR ENVELOPE POWER SUPPLY CIRCUITRY

(71) Applicant: Qorvo US, Inc., Greensboro, NC (US)

(72) Inventors: Nadim Khlat, Cugnaux (FR); Michael R. Kay, Summerfield, NC (US); James M. Retz, Cedar Rapids, IA (US)

(73) Assignee: QORVO US, INC., Greensboro, NC (US)

( * ) Notice: Subject to any disclaimer, the term of this patent is extended or adjusted under 35 U.S.C. 154(b) by 137 days.

(21) Appl. No.: 17/142,350

(22) Filed: Jan. 6, 2021

(65) Prior Publication Data
US 2021/0211112 A1 Jul. 8, 2021

Related U.S. Application Data

(60) Provisional application No. 62/957,992, filed on Jan. 7, 2020, provisional application No. 62/958,440, filed on Jan. 8, 2020.

(51) Int. Cl.
*H03F 3/45* (2006.01)
*H03G 5/16* (2006.01)
*H03F 1/02* (2006.01)

(52) U.S. Cl.
CPC ........... *H03G 5/165* (2013.01); *H03F 1/0233* (2013.01); *H03F 3/45475* (2013.01);
(Continued)

(58) Field of Classification Search
CPC .... H03G 5/165; H03G 2201/103; H03G 5/16; H03G 5/28; H03G 3/3042; H03G 3/004;
(Continued)

(56) References Cited

U.S. PATENT DOCUMENTS

| | | | |
|---|---|---|---|
| 5,507,171 A | * | 4/1996 | Mattes .................... G01K 7/20 73/862.623 |
| 6,032,109 A | * | 2/2000 | Ritmiller, III ....... G01D 3/0365 73/1.01 |

(Continued)

FOREIGN PATENT DOCUMENTS

| | | | |
|---|---|---|---|
| JP | 60001915 | * | 1/1985 |
| WO | 2012151594 A2 | | 11/2012 |

OTHER PUBLICATIONS

International Search Report and Written Opinion for International Patent Application No. PCT/US2021/049801, dated Jan. 4, 2022, 20 pages.

(Continued)

*Primary Examiner* — Khanh V Nguyen
(74) *Attorney, Agent, or Firm* — Withrow & Terranova, P.L.L.C.

(57) ABSTRACT

Equalizer circuitry includes a differential target voltage input, an equalizer output, a first operational amplifier, and a second operational amplifier. The differential target voltage input includes a target voltage input node and an inverted target voltage input node. The first operational amplifier and the second operational amplifier are coupled in series between the differential target voltage input and the equalizer output. The first operational amplifier is configured to receive a target voltage signal and provide an intermediate signal based on the target voltage input signal. The second operational amplifier is configured to receive the intermediate signal and an inverted target voltage signal and provide an output signal to the equalizer output. The first operational amplifier and the second operational amplifier are interconnected with one or more passive components such that a transfer function between the differential target (Continued)

voltage input and the equalizer output is a second-order complex-zero function.

19 Claims, 12 Drawing Sheets

(52) U.S. Cl.
CPC .. *H03F 2200/105* (2013.01); *H03F 2200/451* (2013.01); *H03G 2201/103* (2013.01)

(58) Field of Classification Search
CPC ............... H03F 1/0233; H03F 3/45475; H03F 2200/105; H03F 2200/451; H03F 1/0222; H03F 2200/102; H03F 2203/45526; H03F 2203/45528; H03F 3/04; H03F 1/0244; H03F 1/0211; H03F 2200/504; H03F 1/0227; H03F 2203/45138; H03F 3/45479; H03F 3/45
USPC .......................................................... 330/69
See application file for complete search history.

(56) References Cited

U.S. PATENT DOCUMENTS

| | | | |
|---|---|---|---|
| 6,556,077 B2 * | 4/2003 | Schaffer | H03F 3/4595 330/69 |
| 6,724,202 B2 * | 4/2004 | Tanizawa | G01L 9/065 73/726 |
| 7,616,062 B2 * | 11/2009 | Miyamoto | H03F 3/08 330/308 |
| 8,433,263 B2 | 8/2013 | Pratt et al. | |
| 9,190,959 B2 | 11/2015 | Camuffo et al. | |
| 9,288,098 B2 | 3/2016 | Yan et al. | |
| 10,439,557 B2 | 10/2019 | Khlat et al. | |
| 10,868,499 B2 | 12/2020 | Gorisse et al. | |
| 11,018,627 B2 | 5/2021 | Khlat | |
| 11,057,012 B2 | 7/2021 | Khlat | |
| 2007/0290748 A1 | 12/2007 | Woo et al. | |
| 2011/0136452 A1 | 6/2011 | Pratt et al. | |
| 2014/0009227 A1 | 1/2014 | Kay et al. | |
| 2014/0097895 A1 | 4/2014 | Khlat et al. | |
| 2014/0111170 A1 | 4/2014 | Shi et al. | |
| 2014/0213196 A1 | 7/2014 | Langer et al. | |
| 2014/0266428 A1 | 9/2014 | Chiron et al. | |
| 2014/0273897 A1 | 9/2014 | Drogi et al. | |
| 2014/0361837 A1 | 12/2014 | Strange et al. | |
| 2015/0031318 A1 | 1/2015 | McCallister | |
| 2016/0164550 A1 | 1/2016 | Pilgram | |
| 2016/0277045 A1 | 9/2016 | Langer | |
| 2019/0020526 A1 | 1/2019 | Khlat et al. | |
| 2020/0036338 A1 | 1/2020 | Gorisse et al. | |
| 2020/0106392 A1 | 4/2020 | Khlat et al. | |
| 2020/0153394 A1 | 5/2020 | Khlat et al. | |
| 2020/0259685 A1 | 8/2020 | Khlat et al. | |
| 2021/0099135 A1 | 4/2021 | Balteanu et al. | |
| 2021/0211112 A1 | 7/2021 | Khlat et al. | |
| 2022/0085766 A1 | 3/2022 | Balteanu et al. | |

OTHER PUBLICATIONS

Ying, K. et al., "A Wideband Envelope Detector with Low Ripple and High Detection Speed," IEEE International Symposium on Circuits and Systems (ISCAS), May 27-30, 2018, Florence, Italy, IEEE, 5 pages.

U.S. Appl. No. 17/142,507, filed Jan. 6, 2021.

European Search Report for European Patent Application No. 21217186.2, dated Jun. 2, 2022, 13 pages.

Non-Final Office Action for U.S. Appl. No. 17/142,507, dated Aug. 17, 2022, 6 pages.

Notice of Allowance for U.S. Appl. No. 17/163,685, dated Aug. 29, 2022, 7 pages.

Kelm, Robert, "Understanding Complex-Conjugate Poles in Filter Theory," Technical Article, allaboutcircuits.com/technical-articles/complex-conjugate-poles-in-filter-theory/, Aug. 30, 2016, EETech Media, LLC, 5 pages.

Non-Final Office Action for U.S. Appl. No. 16/199,532, dated Apr. 17, 2020, 6 pages.

Notice of Allowance for U.S. Appl. No. 16/199,532, dated Aug. 11, 2020, 7 pages.

Written Opinion for International Patent Application No. PCT/US2021/049801, dated Oct. 12, 2022, 8 pages.

Notice of Allowance for U.S. Appl. No. 17/142,507, dated Feb. 16, 2023, 7 pages.

Notice of Allowance for U.S. Appl. No. 17/183,714, dated Dec. 7, 2022, 7 pages.

International Preliminary Report on Patentability for International Patent Application No. PCT/US2021/049801, dated Jan. 24, 2023, 21 pages.

\* cited by examiner

EQUALIZER FOR ENVELOPE POWER SUPPLY CIRCUITRY

RELATED APPLICATIONS

This application claims the benefit of provisional patent application Ser. No. 62/957,992, filed Jan. 7, 2020, and provisional patent application Ser. No. 62/958,440, filed Jan. 8, 2020, the disclosures of which are hereby incorporated herein by reference in their entireties.

FIELD OF THE DISCLOSURE

The present disclosure is related to envelope tracking power supply circuitry, and in particular to envelope tracking power supply circuitry with reduced complexity and improved envelope tracking capability.

BACKGROUND

Envelope tracking power supplies for radio frequency (RF) power amplifiers enable increased performance and efficiency. However, circuitry for generating envelope tracking signals is often complex and, in some situations, cannot generate an ideal envelope tracking power supply signal. Accordingly, there is a need for envelope tracking power supply circuitry with reduced complexity and improved envelope tracking capability.

SUMMARY

In one embodiment, equalizer circuitry includes a differential target voltage input, an equalizer output, a first operational amplifier, and a second operational amplifier. The differential target voltage input includes a target voltage input node and an inverted target voltage input node. The first operational amplifier and the second operational amplifier are coupled in series between the differential target voltage input and the equalizer output. The first operational amplifier is configured to receive a target voltage signal from the target voltage input node and provide an intermediate signal based on the target voltage input signal. The second operational amplifier is configured to receive the intermediate signal from the first operational amplifier and an inverted target voltage signal from the inverted target voltage input node and provide an output signal to the equalizer output. The first operational amplifier and the second operational amplifier are interconnected with one or more passive components such that a transfer function between the differential target voltage input and the equalizer output is a second-order complex-zero function. By providing the target voltage signal to the first operational amplifier and the intermediate signal along with the inverted target voltage signal to the second operational amplifier, a second-order complex-zero transfer function can be achieved using only two operational amplifiers. This results in a small footprint, high efficiency, and high bandwidth equalizer circuitry.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
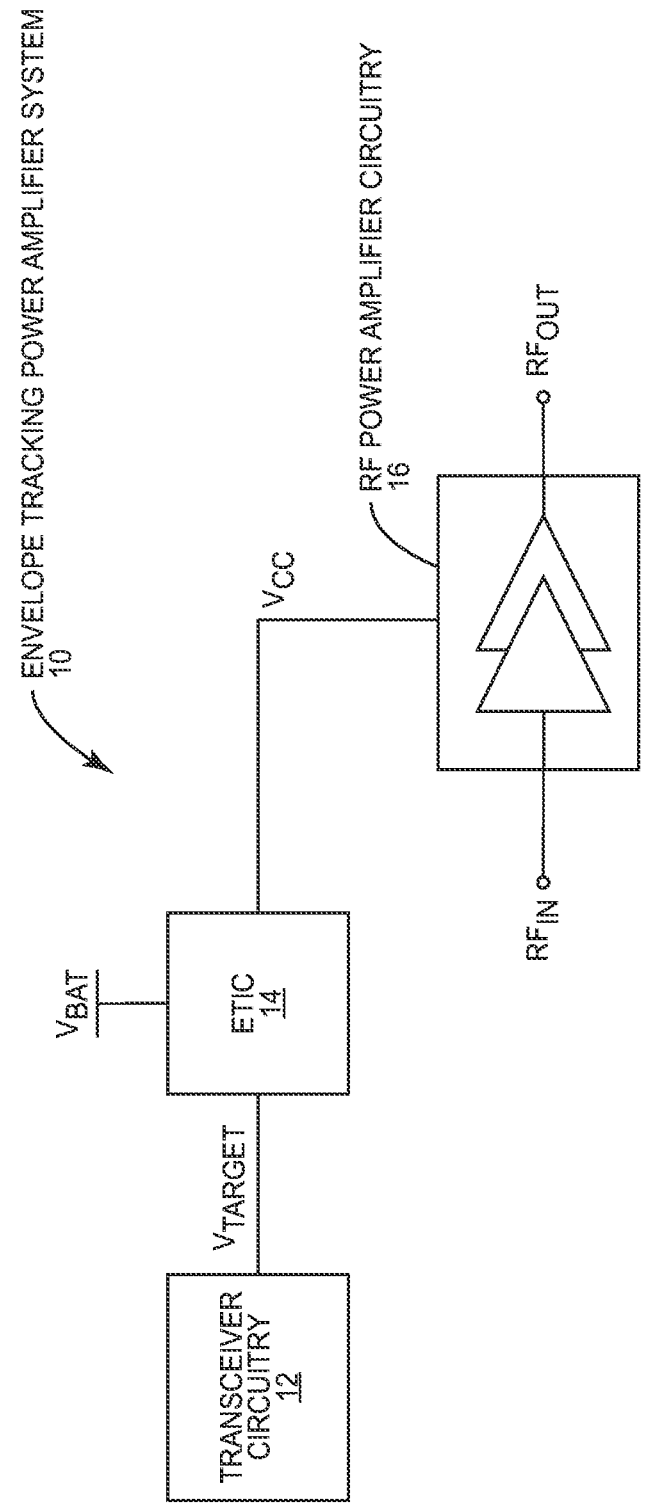
FIG. 1 is a diagram illustrating an envelope tracking power amplifier system according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 illustrates a simplified version of an envelope tracking power amplifier system 10 according to one embodiment of the present disclosure. The envelope tracking power amplifier system 10 includes transceiver circuitry 12, an envelope tracking integrated circuit (ETIC) 14 coupled to the transceiver circuitry 12, and radio frequency (RF) power amplifier circuitry 16 coupled to the ETIC 14 such that the ETIC is coupled between the transceiver circuitry 12 and the RF power amplifier circuitry 16. In addition to other functions that are not directly pertinent to the present disclosure and thus not discussed herein, the transceiver circuitry 12 is configured to generate a time-variant target voltage signal $V_{target}$ indicative of a power envelope of an RF input signal $RF_{in}$, which is an RF signal to be amplified by the RF power amplifier circuitry 16. The ETIC 14 is configured to produce a time-variant envelope tracking supply voltage $V_{cc}$ for the RF power amplifier circuitry 16 based on the target voltage signal $V_{target}$ such that the envelope tracking supply voltage $V_{cc}$ tracks the power envelope of the RF input signal $RF_{in}$. The RF power amplifier circuitry 16 is configured to amplify the RF input signal $RF_{in}$ based on the envelope tracking supply voltage $V_{cc}$ to provide an RF output signal $RF_{out}$, which may then subsequently be transmitted from an antenna (not shown).

Those skilled in the art will appreciate that the RF power amplifier circuitry 16 may operate with improved efficiency and linearity when the envelope tracking supply voltage $V_{cc}$ accurately tracks the power envelope of the RF input signal $RF_{in}$. This is achieved when the envelope tracking supply voltage $V_{cc}$ is temporally aligned with the target voltage signal $V_{target}$. Temporal alignment between the envelope tracking supply voltage $V_{cc}$ and the target voltage signal may be complicated by the load presented by the RF power amplifier circuitry 16 to the ETIC 14 and stray inductances caused by signal lines (e.g., circuit board traces) located between the ETIC 14 and the RF power amplifier circuitry 16.

Figure 2:
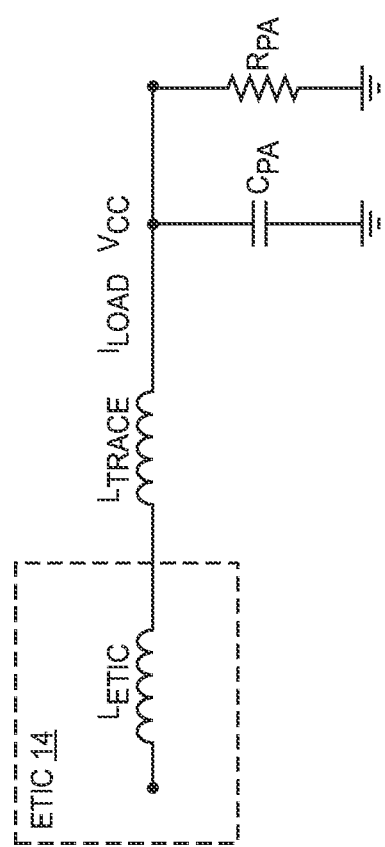
FIG. 2 is a diagram illustrating an equivalent circuit for a load presented by radio frequency (RF) power amplifier circuitry to an envelope tracking integrated circuit (ETIC).

To illustrate this, FIG. 2 shows a simplified equivalent circuit for the load presented to the ETIC 14 by the RF power amplifier circuitry 16. An output inductance of the ETIC 14 is illustrated as $L_{ETIC}$, an inductance caused by circuit board traces between the ETIC 14 and the RF power amplifier circuitry 16 is illustrated as $L_{trace}$, a capacitance of the RF power amplifier circuitry 16 as presented to the ETIC 14 is illustrated as $C_{PA}$, and a resistance of the RF power amplifier circuitry 16 as presented to the ETIC 14 is illustrated as $R_{PA}$. As discussed above, the ETIC provides the envelope tracking supply voltage $V_{cc}$ to the RF power amplifier circuitry 16. Due to the load presented by the RF power amplifier circuitry 16, a load current $I_{load}$ is also generated. The load current $I_{load}$ is based on the envelope tracking supply voltage $V_{cc}$. A transfer function H(s) can be calculated for the equivalent circuitry shown in FIG. 2. A transfer function of a system (in the s-domain) can be expressed according to Equation 1:

$$H(s) = \frac{N(s)}{D(s)} \quad (1)$$

where N(s) and D(s) are simple polynomials that define one or more zeros and one or more poles of the transfer function, respectively, and $s=j2\pi f$. The one or more zeros are the roots of the polynomial equation N(s) and can be determined by solving the equation N(s)=0. The order of the polynomial N(s) determines the number of zeros of the transfer function H(s). Each zero corresponds to a zero output of the transfer function H(s). The polynomial N(s) is a zero-order polynomial when N(s) represents a constant value, is a first-order polynomial when $N(s)=1+b_0 s$ (where $b_0$ is a constant), is a second-order polynomial when $N(s)=1+b_0s+b_1s^2$ (where $b_1$ is a constant), and so on. When $N(s)$ is a second-order polynomial, the transfer function $H(s)$ is referred to herein as a second-order complex-zero transfer function.

In contrast to the zeros, the one or more poles are the roots of the polynomial $D(s)$ and can be determined by solving the equation $D(s)=0$. The order of the polynomial $D(s)$ determines the number of poles of the transfer function $H(s)$. Each pole corresponds to an infinite output of the transfer function $H(s)$. The polynomial $D(s)$ is a zero-order polynomial when $D(s)$ represents a constant value, is a first-order polynomial when $D(s)=1+a_0s$ (where $a_0$ is a constant), is a second-order polynomial when $D(s)=1+a_0s+a_1s^2$ (where $a_1$ is a constant), and so on. When $D(s)$ is a second-order polynomial, the transfer function $H(s)$ is referred to herein as a second-order complex-pole transfer function.

Figure 3:
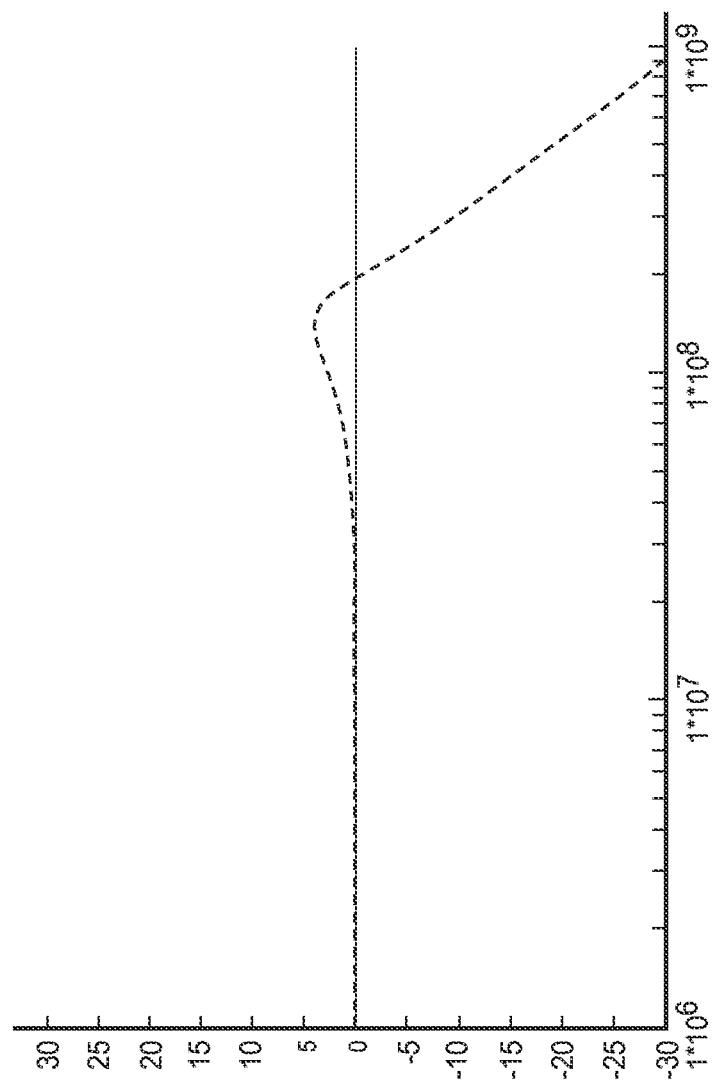
FIG. 3 is a graph illustrating a transfer function of a load presented by RF power amplifier circuitry to an ETIC.

Turning back to the equivalent circuit shown in FIG. 2, the transfer function $H(s)$ of the equivalent circuit can be calculated according to Equation 2:

$$H(s) = \frac{1}{1+\left(\frac{LE}{R_{PA}}\right)s+(LE*C_{PA})s^2} \quad (2)$$

where $LE=L_{ETIC}+L_{trace}$. The transfer function $H(s)$ provided by the load presented by the RF power amplifier circuitry 16 has two complex poles that are complex conjugates, and thus is referred to as a second-order complex-pole transfer function. A graph of the transfer function $H(s)$ over frequency is illustrated in FIG. 3 for given values LE=4 nH, $C_{PA}$=250 pF, and $R_{PA}$=6Ω. As shown, the complex pole pair causes peaking at around 141 MHz, and a steep decline thereafter. Ideally, this curve would remain flat throughout the entire bandwidth. Going back to the envelope tracking power amplifier system 10 discussed with respect to FIG. 1, the above means that the envelope tracking supply voltage $V_{cc}$ will not accurately track the power envelope of the RF input signal $RF_{in}$ in some situations, which may lead to decreased performance and/or efficiency.

Figure 4:
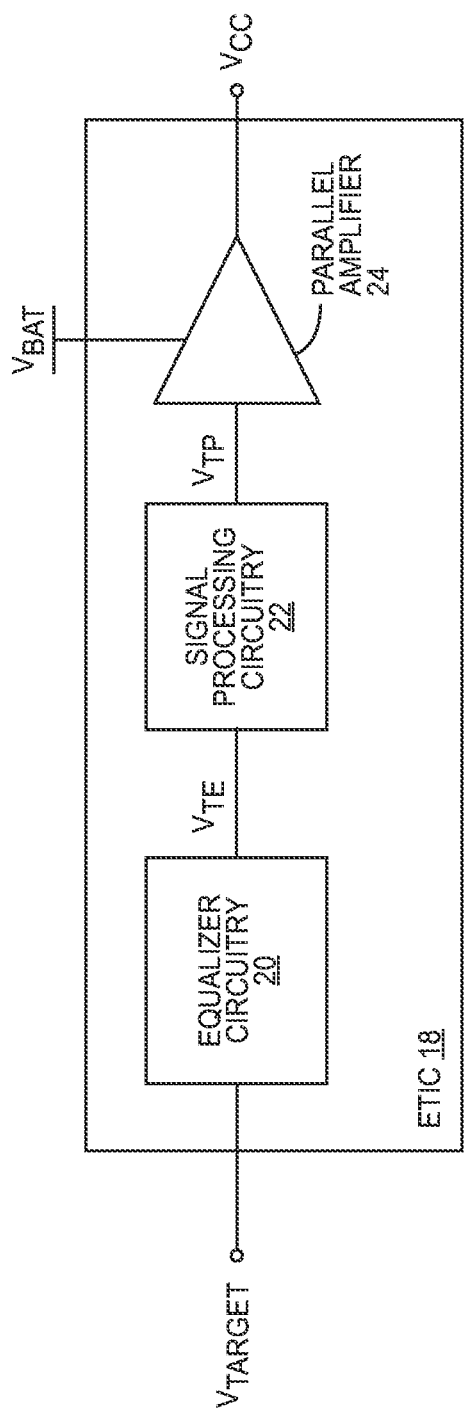
FIG. 4 is a diagram illustrating an ETIC according to one embodiment of the present disclosure.

In an effort to solve the aforementioned issues, FIG. 4 illustrates an ETIC 18 according to one embodiment of the present disclosure. The ETIC 18 includes equalizer circuitry 20, signal processing circuitry 22 coupled to the equalizer circuitry 20, and a parallel amplifier 24 coupled to the signal processing circuitry 22 such that the signal processing circuitry 22 is coupled between the equalizer circuitry 20 and the parallel amplifier 24. The equalizer circuitry 20 is configured to receive the target voltage signal $V_{target}$ and provide an equalized target voltage signal $V_{te}$, which compensates for the poles in the transfer function introduced by the load of the RF power amplifier circuitry 16 discussed above. The details of how this is accomplished are discussed below.

The signal processing circuitry 22 may perform further signal processing on the equalized target voltage signal $V_{te}$, such as anti-aliasing or other digital signal processing, to provide a processed target voltage signal $V_{tp}$. The processed target voltage $V_{tp}$ is provided to the parallel amplifier 24, which amplifies a battery voltage $V_{bat}$ based on the processed target voltage signal $V_{tp}$ to provide the envelope tracking supply voltage $V_{cc}$ to the RF power amplifier circuitry 16. Notably, the ETIC 14 illustrated in FIG. 4 is simplified in order to more clearly illustrate the principles of the present disclosure. In practice, the ETIC 14 will include additional circuitry in order to effectively generate the envelope tracking supply voltage $V_{cc}$. Such additional circuitry is contemplated by the present disclosure but not shown to avoid obscuring the concepts described herein.

Figure 5:
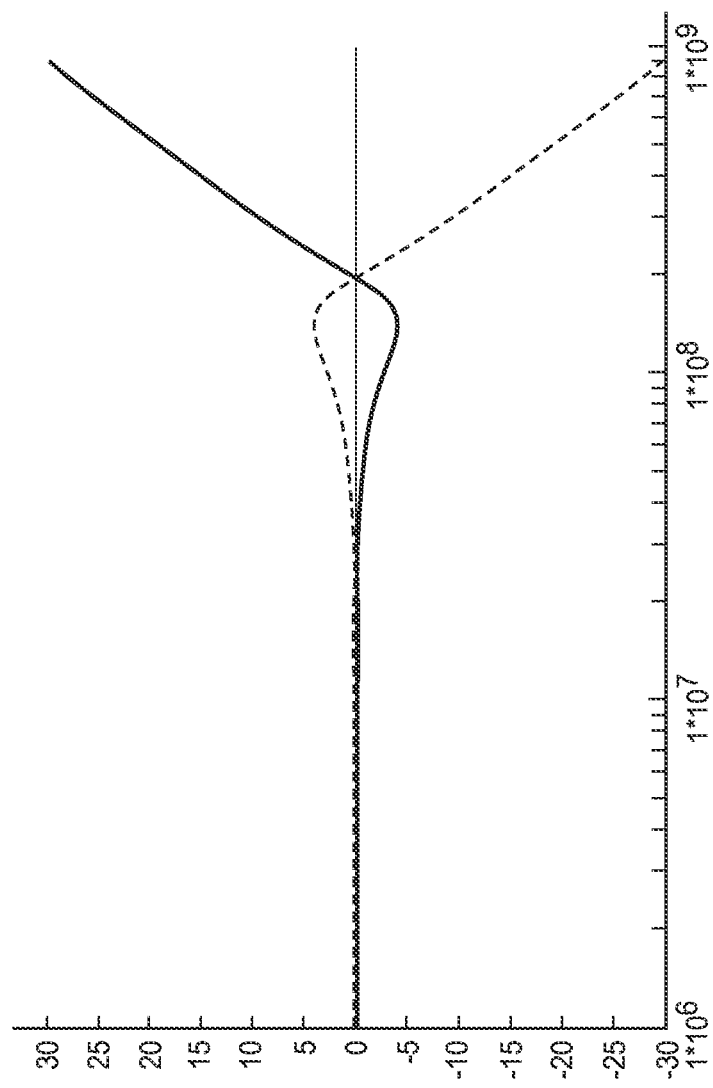
FIG. 5 is a graph illustrating a transfer function of a load presented by RF power amplifier circuitry to an ETIC along with a transfer function of equalizer circuitry according to one embodiment of the present disclosure.

As discussed above, the equalizer circuitry 18 is provided to equalize the target voltage signal $V_{target}$ to effectively cancel the transfer function $H(s)$ provided by the load presented by the RF power amplifier circuitry 16 discussed above with respect to FIGS. 2 and 3. To do so, the equalizer circuitry 18 should provide a transfer function equal to Equation 3:

$$H(s) = A*\left(1+\left(\frac{LE}{R_{PA}}\right)s+(LE*C_{PA})s^2\right) \quad (3)$$

where A is a constant value or gain. The above transfer function $H(s)$ is a second-order polynomial in the numerator, and is therefore referred to as a second-order complex-zero transfer function. Notably, the numerator of the transfer function $H(s)$ of Equation 3 effectively cancels the denominator of the transfer function $H(s)$ of Equation 2. The transfer function $H(s)$ of Equation 3 is graphed along with the transfer function $H(s)$ of Equation 2 in FIG. 5, where the solid line is the transfer function $H(s)$ of Equation 3 and the dashed line is the transfer function $H(s)$ of Equation 2 for given values LE=4 nH, $C_{PA}$=250 pF, and $R_{PA}$=6Ω. As shown, the transfer functions are essentially equal but opposite, thereby cancelling one another out and effectively resulting in a flat response across the entirety of the bandwidth. As discussed above, this is desirable so that the envelope tracking supply voltage $V_{cc}$ can accurately track the power envelope of the RF input signal $RF_{in}$, thereby allowing the RF power amplifier circuitry 16 to accurately and efficiently amplify the signal to provide the RF output signal $RF_{out}$.

Conventional designs for equalizer circuitry capable of providing a second-order complex-zero transfer function such as the one shown in Equation 3 above are complex and consume a large amount of power. Accordingly, they are generally unsuitable for mobile devices or other applications in which power consumption is a design concern. Further, conventional designs may require a large number of components, thereby making them large and thus again unsuitable for mobile devices or other applications in which size is a design concern.

Figure 6:
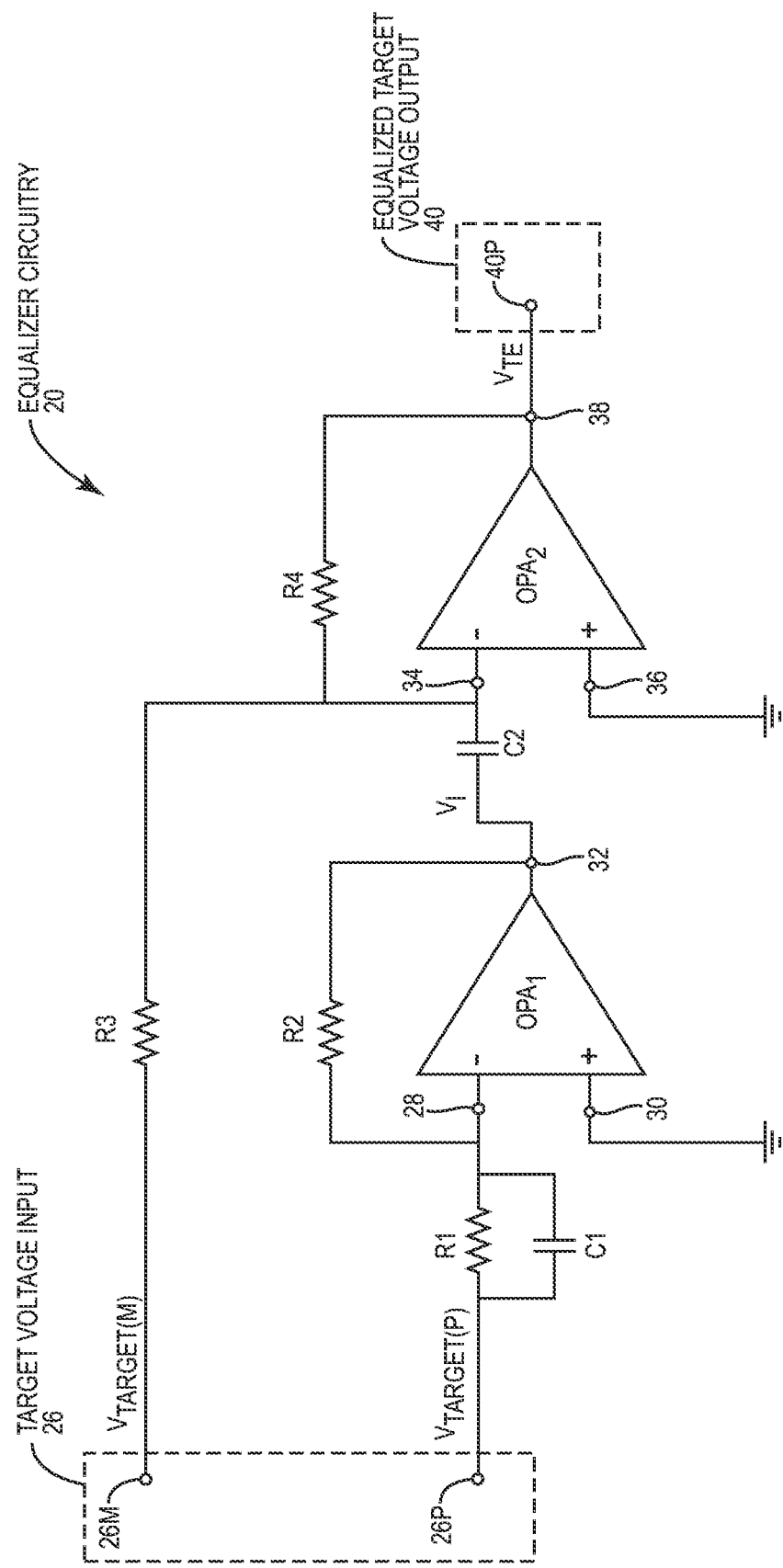
FIG. 6 is a diagram illustrating equalizer circuitry according to one embodiment of the present disclosure.

Accordingly, FIG. 6 shows equalizer circuitry 20 according to one embodiment of the present disclosure. Before diving into the details of the equalizer circuitry 20, it is important to note that while the target voltage signal $V_{target}$ is shown being provided to the equalizer circuitry 20 as a single-ended signal in FIGS. 1 and 4, the target voltage signal $V_{target}$ is actually generally provided from the transceiver circuitry 12 as a differential voltage including a target voltage signal $V_{target(p)}$ and an inverted target voltage signal $V_{target(m)}$, where the letter "p" refers to a "plus" target voltage and the letter "m" refers to a "minus" target voltage. Accordingly, the equalizer circuitry 20 is shown including a target voltage input 26 including a target voltage input node 26P and an inverted target voltage input node 26M. It is important that the target voltage signal $V_{target}$ is provided as a differential signal in order for the equalizer circuitry 20 to provide the desired second-order complex-zero transfer function discussed above using only two operational amplifiers.

The equalizer circuitry 20 includes a first operational amplifier $OPA_1$ and a second operational amplifier $OPA_2$.

The first operational amplifier $OPA_1$ includes a first inverting input node 28, a first non-inverting input node 30, and a first output node 32. The first inverting input node 28 is coupled to the target voltage input node 26P via a first resistor R1 and a first capacitor C1, which are coupled in parallel with one another. A second resistor R2 is coupled between the first inverting input node 28 and the first output node 32. The first non-inverting input node 30 is coupled to ground. The second operational amplifier $OPA_2$ includes a second inverting input node 34, a second non-inverting input node 36, and a second output node 38. The second inverting input node 34 is coupled to the first output node 32 via a second capacitor C2. Further, the second inverting input node 34 may be coupled to the inverted target voltage input node 26M via a third resistor R3, and additionally may be coupled to the second output node 38 via a fourth resistor R4. The second non-inverting input node 36 is coupled to ground. The second output node 38 may be coupled to an equalized target voltage output 40, and specifically to an equalized target voltage output node 40P in the equalized target voltage output 40. While the equalized target voltage output 40 is shown as a single-ended output including only the equalized target voltage output node 40P, it may also include an inverted equalized target voltage output node (not shown) in some embodiments such that the equalized target voltage output 40 is a differential output as illustrated in additional embodiments below.

In operation, the first operational amplifier $OPA_1$ receives the target voltage signal $V_{target(p)}$ and provides an intermediate signal $V_i$, which is based on the target voltage signal $V_{target(p)}$. The second operational amplifier $OPA_2$ receives the intermediate signal $V_i$ and the inverted target voltage signal $V_{target(m)}$ and provides an equalized target voltage signal $V_{te}$ to the equalized target voltage output 40. A transfer function between the target voltage input node 26P and the equalized target voltage output node 40P can be provided as in Equation 4:

$$H(s) = \frac{R4}{R3} * \left[1 + R3 * \left(\frac{R2}{R1}\right) * C2 * s * (1 + R1 * C1 * s)\right] \quad (4)$$

Those skilled in the art will appreciate that the transfer function H(s) of Equation 4 is a second-order complex-zero transfer function. By appropriately adjusting the values of R1-R4, C1, and C2, the equalizer circuitry 20 may be designed to effectively cancel the load presented by the RF power amplifier circuitry 16 to the ETIC 18, thereby allowing the envelope tracking supply voltage $V_{cc}$ to accurately track the power envelope of the RF input signal $RF_{in}$ over a wide bandwidth and improving the performance of the RF power amplifier circuitry 16. Further, the values of the R1-R4, C1, and C2 may be chosen such that the zeros in the transfer function H(s) are complex conjugates. Notably, the second-order complex-zero transfer function is achieved using only two operational amplifiers. This is accomplished by exploiting the differential nature of the target voltage signal $V_{target}$. Providing a second-order complex-zero transfer function in such a simplified circuit topology results in a reduced footprint of the equalizer circuitry 20 as well as improved efficiency and bandwidth. While not shown, any of R1-R4, C1, and C2 may be adjustable components that are adjusted by control circuitry that is internal or external to the equalizer circuitry 20 and may be adjusted based on one or more operational conditions of the equalizer circuitry 20, the ETIC 18, and/or the RF power amplifier circuitry 16.

Figure 7:
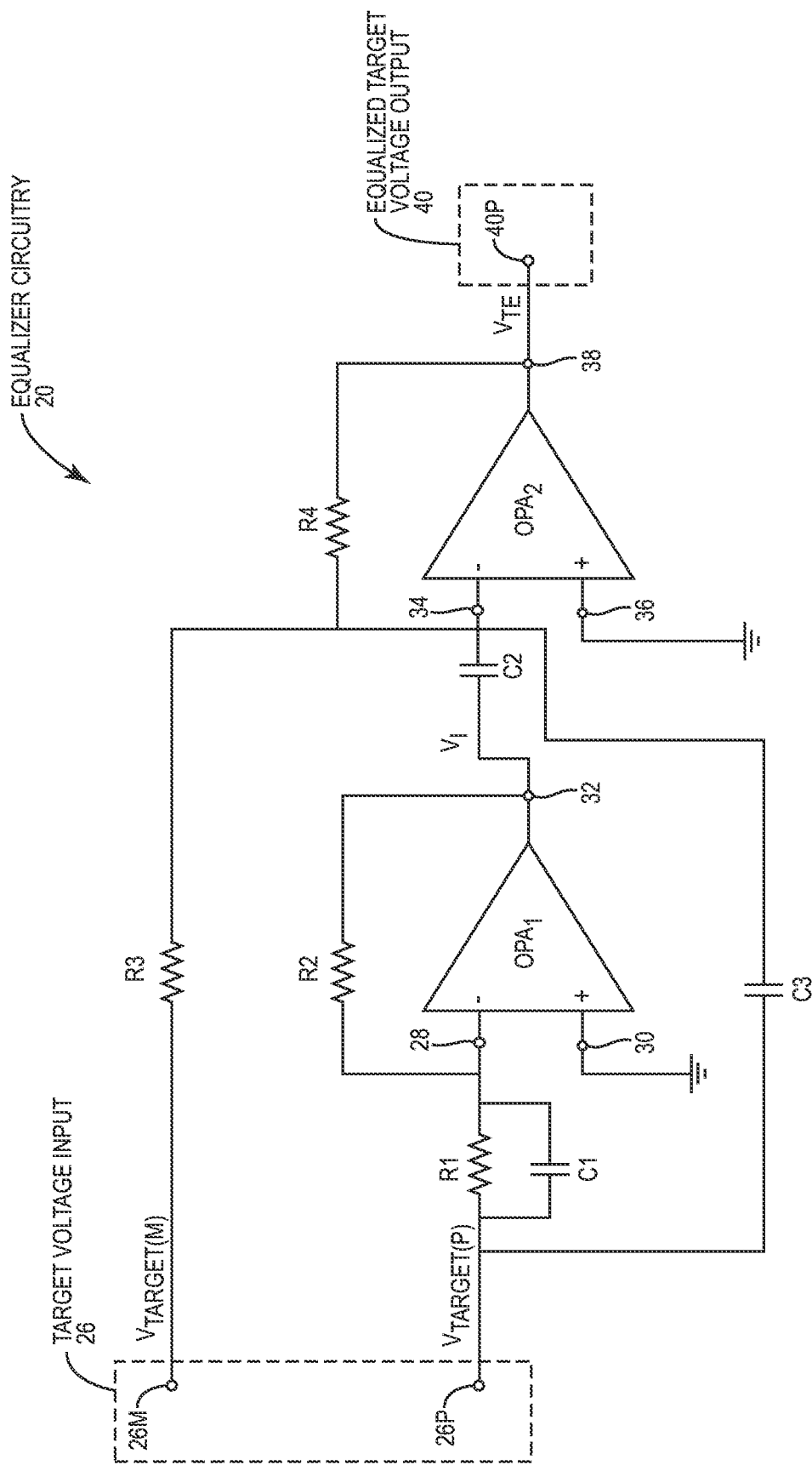
FIG. 7 is a diagram illustrating equalizer circuitry according to one embodiment of the present disclosure.

FIG. 7 shows the equalizer circuitry 20 according to an additional embodiment of the present disclosure. The equalizer circuitry 20 shown in FIG. 7 is substantially similar to that shown in FIG. 6, but further includes a third capacitor C3 coupled between the target voltage input node 26P and the second inverting input node 34. The equalizer circuitry 20 in FIG. 7 will operate similarly to that shown in FIG. 6, but will provide a transfer function between the target voltage input node 26P and the equalized target voltage output node 40P as in Equation 5:

$$H(s) = \frac{R4}{R3} * \left[1 + \left(R3 * \left(\frac{R2}{R1}\right) * C2 - R3 * C3\right) * s + R3 * C2 * R2 * C1 * s^2\right] \quad (5)$$

Once again, the equalizer circuitry 20 provides a second-order complex-zero transfer function. By appropriately adjusting the values of R1-R4 and C1-C3, the equalizer circuitry 20 may be designed to effectively cancel the load presented by the RF power amplifier circuitry 16 to the ETIC 18, thereby allowing the envelope tracking supply voltage $V_{cc}$ to accurately track the power envelope of the RF input signal $RF_{in}$ over a wide bandwidth and improving the performance of the RF amplifier circuitry 16. As in the above, the values of R1-R4 and C1-C3 may be chosen such that the zeros in the transfer function H(s) are complex conjugates. The equalizer circuitry 20 shown in FIG. 7 thus provides the same benefits as discussed above with respect to FIG. 6. While not shown, any of R1-R4 and C1-C3 may be adjustable components that are adjusted by control circuitry that is internal or external to the equalizer circuitry 20 and may be adjusted based on one or more operational conditions of the equalizer circuitry 20, the ETIC 18, and/or the RF power amplifier circuitry 16.

Figure 8:
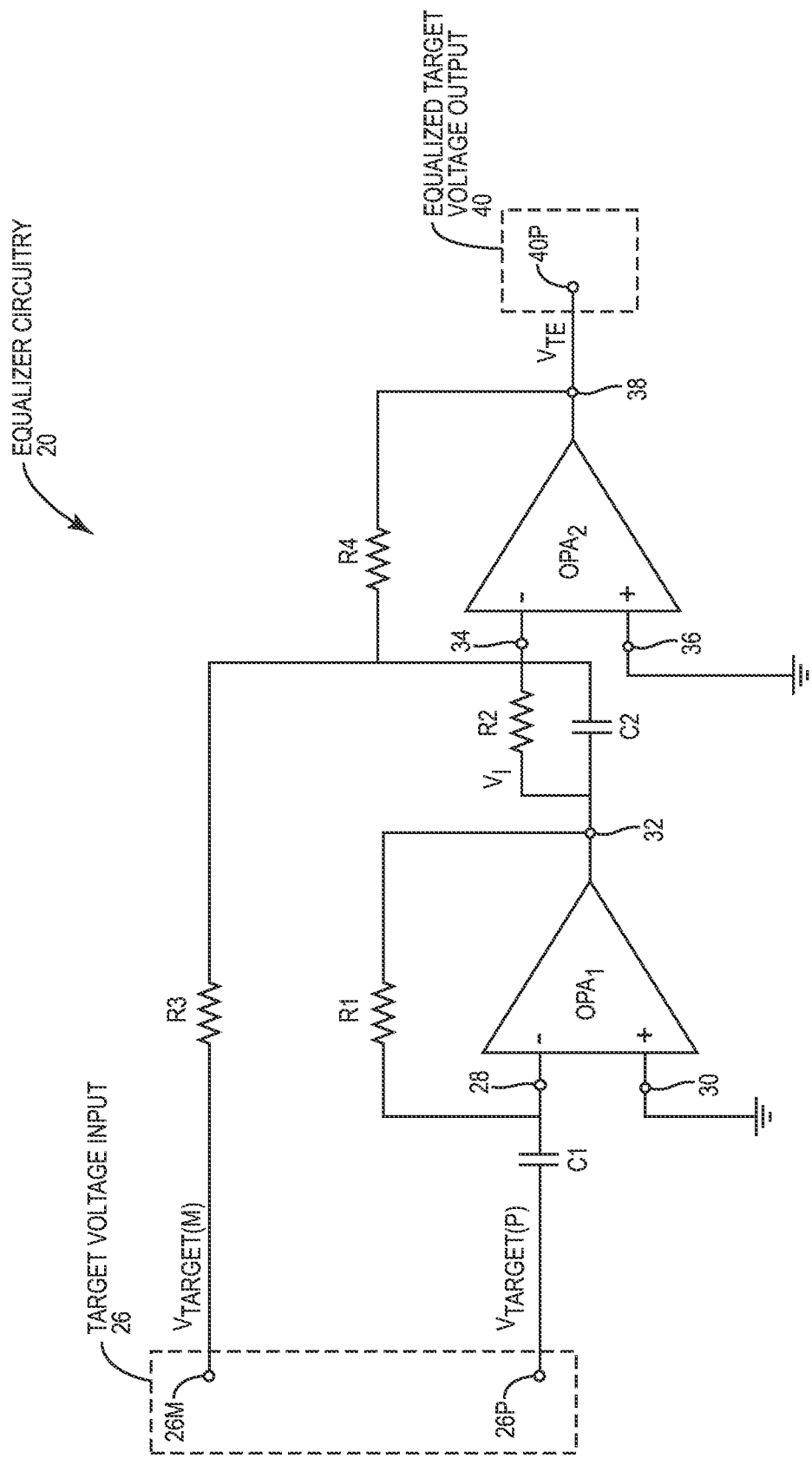
FIG. 8 is a diagram illustrating equalizer circuitry according to one embodiment of the present disclosure.

FIG. 8 shows the equalizer circuitry 20 according to an additional embodiment of the present disclosure. The equalizer circuitry 20 shown in FIG. 8 is substantially similar to that shown in the figures above, except for the interconnections between the operational amplifiers and the passive components. Specifically, the first inverting input 28 is coupled to the target voltage input node 26P via a first capacitor C1. The first inverting input 28 is also coupled to the first output 32 via a first resistor R1. The first non-inverting input 30 is coupled to ground. The second inverting input 34 is coupled to the first output 32 via a second resistor R2 and a second capacitor C2, which are coupled in parallel with one another. The second inverting input node 34 is also coupled to the inverted target voltage node 26M via a third resistor R3, and additionally is coupled to the second output node 38 via a fourth resistor R4. The second non-inverting input 36 is coupled to ground. The second output is coupled to the equalized target voltage output node 40P of the equalized target voltage output 40.

The equalizer circuitry 20 shown in FIG. 8 operates in a substantially similar manner to that discussed above with respect to FIGS. 6 and 7, but provides a different transfer function as shown in Equation 6:

$$H(s) = \frac{R4}{R3} * \left[1 + R3 * \left(\frac{R1}{R2}\right) * C1 * s * (1 + R2 * C2 * s)\right] \quad (6)$$

Once again, the equalizer circuitry 20 provides a second-order complex-zero transfer function. By appropriately adjusting the values of R1-R4, C1, and C2, the equalizer circuitry 20 may be designed to effectively cancel the load presented by the RF power amplifier circuitry 16 to the ETIC 18, thereby allowing the envelope tracking supply voltage $V_{cc}$ to accurately track the power envelope of the RF input signal $RF_1$ over a wide bandwidth and improving the performance of the RF amplifier circuitry 16. As in the above, the values of R1-R4, C1, and C2 may be chosen such that the zeros in the transfer function H(s) are complex conjugates. The equalizer circuitry 20 shown in FIG. 8 thus provides the same benefits as discussed above with respect to FIG. 6. While not shown, any of R1-R4, C1, and C2 may be adjustable components that are adjusted by control circuitry that is internal or external to the equalizer circuitry 20 and may be adjusted based on one or more operational conditions of the equalizer circuitry 20, the ETIC 14, and/or the RF power amplifier circuitry 16.

Figure 9:
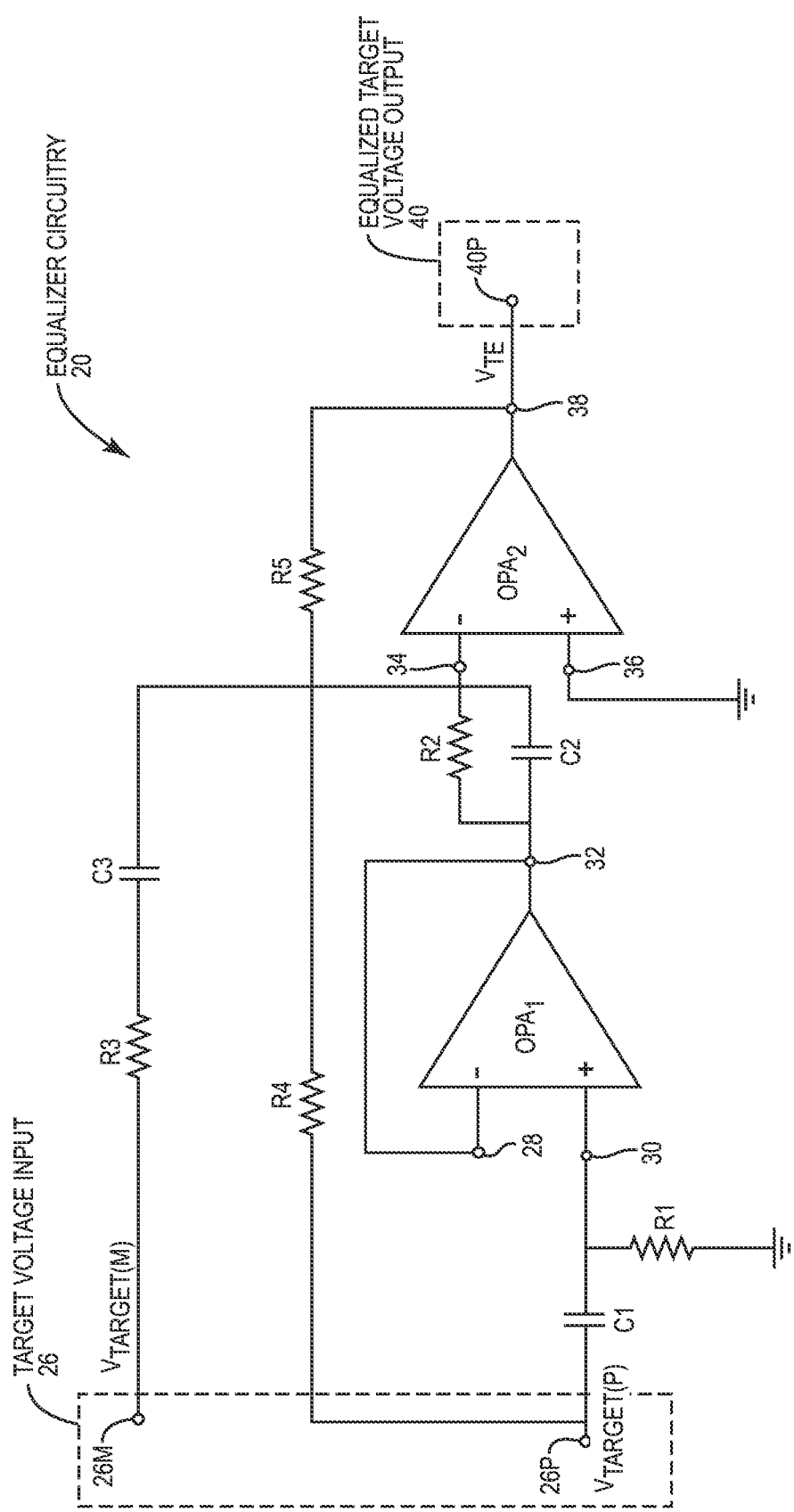
FIG. 9 is a diagram illustrating equalizer circuitry according to one embodiment of the present disclosure.

FIG. 9 shows the equalizer circuitry 20 according to an additional embodiment of the present disclosure. The equalizer circuitry 20 shown in FIG. 9 is substantially similar to that shown in the figures above, except for the interconnections between the operational amplifiers and the passive components. Specifically, the first inverting input node 28 is coupled directly to the first output node 32. The first non-inverting input node 30 is coupled to the target voltage input node 26P via a first capacitor C1, and to ground via a first resistor R1. The second inverting input node 34 is coupled to the first output 32 via a second resistor R2 and a second capacitor C2, which are coupled in parallel with one another. The second inverting input node 34 is also coupled to the inverting target voltage input node 26M via a third resistor R3 and a third capacitor C3, which are coupled in series with one another, to the target voltage input node 26P via a fourth resistor R4, and to the second output node 38 via a fifth resistor R5. The second output node 38 is coupled to the equalized target voltage output node 40P of the equalized target voltage output 40.

The equalizer circuitry 20 shown in FIG. 9 operates in a substantially similar manner to that discussed above with respect to FIGS. 6 through 8, except that the first operational amplifier $OPA_1$ acts as a buffer stage, which may allow for a wider bandwidth of the equalizer circuitry 20. A transfer function of the equalizer circuitry 20 of FIG. 9 is as shown in Equation 7:

$$H(s) = \frac{R5}{R4} * \frac{1 + \left(\frac{R4}{R2} * R1 * C1 - R4 * C3\right) * s + R1 * C1 * R4 * C2 * s^2}{1 + R1 * C1 * s} \quad (7)$$

Once again, the equalizer circuitry 20 provides a second-order complex-zero transfer function. By appropriately adjusting the values of R1-R5 and C1-C3, the equalizer circuitry 20 may be designed to effectively cancel the load presented by the RF power amplifier circuitry 16 to the ETIC 18, thereby allowing the envelope tracking supply voltage $V_{cc}$ to accurately track the power envelope of the RF input signal $RF_{in}$ over a wide bandwidth and improving the performance of the RF power amplifier circuitry 16. As in the above, the values of R1-R4 and C1-C3 may be chosen such that the zeros in the transfer function H(s) are complex conjugates. The equalizer circuitry 20 in FIG. 9 thus provides the same benefits as discussed above with respect to FIG. 6. While not shown, any of R1-R4 and C1-C3 may be adjustable components that are adjusted by control circuitry that is internal or external to the equalizer circuitry 20 and may be adjusted based on one or more operational conditions of the equalizer circuitry 20, the ETIC 18, and/or the RF power amplifier circuitry 16.

Figure 10:
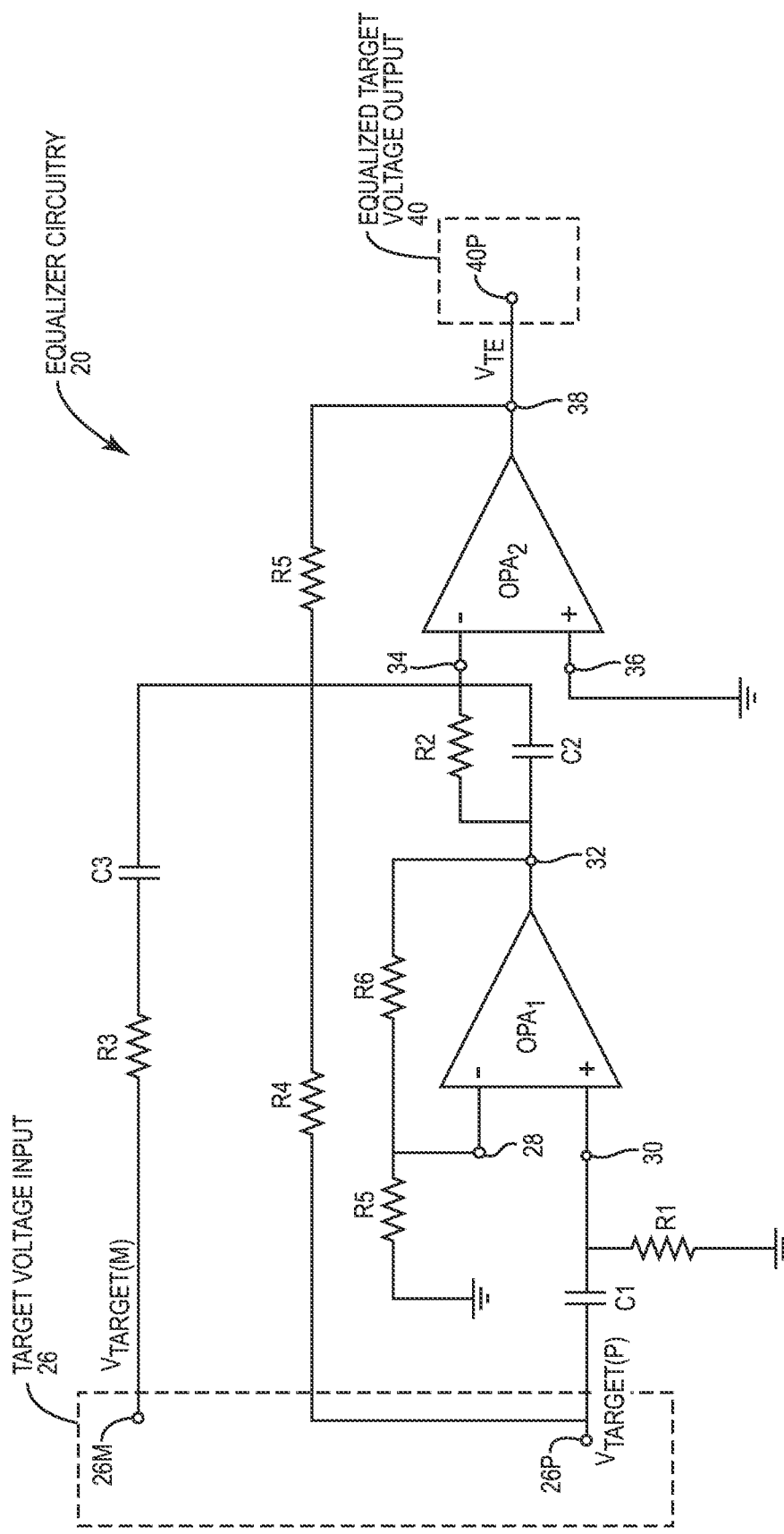
FIG. 10 is a diagram illustrating equalizer circuitry according to one embodiment of the present disclosure.

FIG. 10 shows the equalizer circuitry 20 according to an additional embodiment of the present disclosure. The equalizer circuitry 20 in FIG. 10 is substantially similar to that shown in FIG. 9, except that it further includes a sixth resistor R6 between the first inverting input node 28 and the first output node 32 and a seventh resistor R7 between the first inverting input node 28 and ground. This change effectively provides a gain on the first operational amplifier $OPA_1$ equal to 1+k where k=R6/R7. The equalizer circuitry operates in a substantially similar way to that discussed above with respect to FIG. 9, but provides a transfer function as shown in Equation 8:

$$H(s) = \frac{R5}{R4} * \frac{1 + \left((1+k) * \frac{R4}{R2} * R1 * C1 - R4 * C3\right) * s + (1+k) * R1 * C1 * R4 * C2 * s^2}{1 + R1 * C1 * s} \quad (8)$$

where, as discussed above, $$k = \frac{R6}{R7}.$$

By appropriately adjusting the values of R1-R7 and C1-C3, the equalizer circuitry 20 may be designed to effectively cancel the load presented by the RF power amplifier circuitry 16 to the ETIC 18, thereby allowing the envelope tracking supply voltage $V_{cc}$ to accurately track the power envelope of the RF input signal $RF_{in}$ over a wide bandwidth and improving the performance of the RF power amplifier circuitry 16. As in the above, the values of R1-R7 and C1-C3 may be chosen such that the zeros in the transfer function H(s) are complex conjugates. The equalizer circuitry 20 in FIG. 10 thus provides the same benefits as discussed above with respect to FIG. 6. While not shown, any of R1-R7 and C1-C3 may be adjustable components that are adjusted based on one or more operational conditions of the equalizer circuitry 20, the ETIC 18, and/or the RF power amplifier circuitry 16.

Figure 11:
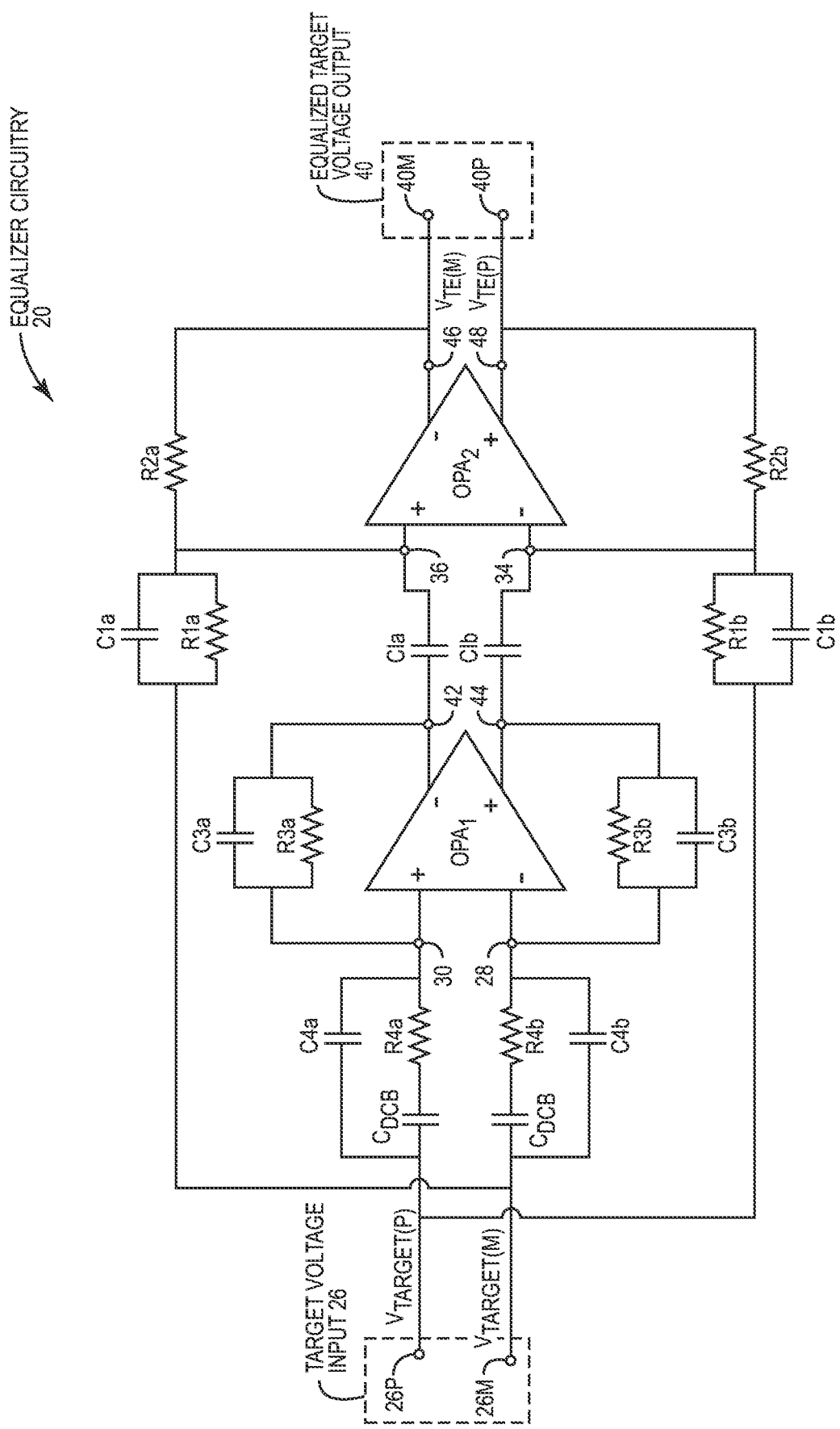
FIG. 11 is a diagram illustrating equalizer circuitry according to one embodiment of the present disclosure.

As discussed above, while only the equalized target voltage signal output node 40P is shown in FIGS. 6-10, the equalized target voltage output 40 may be a differential output that further includes an inverted equalized target voltage signal output node 40M. FIG. 11 thus shows the equalizer circuitry 20 designed for providing a differential output signal using differential operational amplifiers. As shown, the first operational amplifier $OPA_1$ includes the first inverting input node 28, the first non-inverting input node 30, a first inverting output node 42, and a first non-inverting output node 44. Similarly, the second operational amplifier $OPA_2$ includes the second inverting input node 34, the second non-inverting input node 36, a second inverting output node 46, and a second non-inverting output node 48. The inverted target voltage input node 26M is coupled to the second non-inverted input node 36 via a first resistor R1a and a first capacitor C1a, which are coupled in parallel with one another. The second non-inverting input node 36 is also coupled to the second inverting output node 46 via a second resistor R2a. The second inverting output node 46 is coupled to the inverted equalized target voltage output node 40M. The first inverting output node 42 is coupled to the second non-inverting input node 36 via an intermediate capacitor C1a. The first non-inverting input node 30 is coupled to the first inverting output node 42 via a third capacitor C3a and a third resistor R3a, which are coupled in parallel with one another. The first non-inverting input node 30 is also coupled to the target voltage input node 26 via a fourth resistor R4a, a fourth capacitor C4a, and a direct current (DC) blocking capacitor $C_{DCB}$, wherein the fourth resistor R4a and the DC blocking capacitor $C_{DCB}$ are coupled in series and the fourth capacitor C4a is coupled in parallel with the series combination of the fourth resistor R4a and the DC blocking capacitor $C_{DCB}$.

Due to the differential topology of the equalizer circuitry 20 shown in FIG. 11, the bottom half of the circuit essentially mirrors the top half. This is why the components discussed above are post-fixed with "a" and the components discussed below are post-fixed with "b". Similar to the above, the target voltage input node 26P is coupled to the second inverted input node 34 via a first additional resistor R1b and a first additional capacitor C1b, which are coupled in parallel with one another. The second inverted input node 34 is also coupled to the second non-inverting output node 48 via a second additional resistor R2b. The first non-inverting output node 44 is coupled to the second inverting output node 34 via an additional intermediate capacitor C1b. The first inverting input node 28 is coupled to the first non-inverting output node 44 via a third additional resistor R3b and a third additional capacitor C3b, which are coupled in parallel with one another. The first inverting input node 28 is also coupled to the inverted target voltage input node 26M via a fourth additional resistor R4b, a fourth additional capacitor C4b, and an additional DC blocking capacitor $C_{DCB}$, wherein the fourth additional resistor R4b and the additional DC blocking capacitor $C_{DCB}$ are coupled in series and the fourth additional capacitor C4b is coupled in parallel with the series combination of the fourth additional resistor R4b and the additional DC blocking capacitor $C_{DCB}$.

Resistors and capacitors having the same numbering (e.g., R1a and R1b) may have the same component values in various embodiments. With this in mind, the equalizer circuitry 20 may operate in a substantially similar manner as that discussed above with respect to FIGS. 6-10, but in a differential fashion such that two signal paths exist through the equalizer circuitry 20. The equalizer circuitry 20 may thus provide a transfer function as defined in Equation 9:

$$H(s) = \frac{R2}{R1} * \left(1 + \frac{R3*R1*CI}{R4}s + R3*R1*C4*CI*s^2\right) \quad (9)$$

where the values for each resistor (e.g., R1a and R1b) are defined by a single value (e.g., R1) in the equation. Once again, the equalizer circuitry 20 provides a second-order complex-zero transfer function. By appropriately adjusting the values of R1-R4, CI, and C1, C3, and C4, the equalizer circuitry 20 may be designed to effectively cancel the load presented by the RF power amplifier circuitry 16 to the ETIC 18, thereby allowing the envelope tracking supply voltage $V_{cc}$ to accurately track the power envelope of the RF input signal $RF_{in}$ over a wide bandwidth and improving the performance of the RF power amplifier circuitry 16. As in the above, the values of R1-R4, CI, and C1, C3, and. C4 may be chosen such that the zeros in the transfer function H(s) are complex conjugates. The equalizer circuitry in FIG. 11 thus provides the same benefits as discussed above with respect to FIG. 6. While not shown, any of R1-R4, CI, and C1, C3, and C4 may be adjustable components that are adjusted based on one or more operational conditions of the equalizer circuitry 20, the ETIC 18, and/or the RF power amplifier circuitry 16. For example, the values of any of R1-R4, CI, and C1, C3, and C4 may be adjusted to provide certain desired zeros, which may be any combination of complex and real.

While not shown in the transfer functions above, in some embodiments the equalizer circuitry 20 may generate poles in addition to zeros. The values of any of the passive components in the equalizer circuitry 20 may be adjusted in order to tailor these poles as desired while maintaining the desired zeros discussed above. Further, while the equalizer circuitry 20 discussed above as always providing a second-order complex-zero transfer function, those skilled in the art will appreciate that the values of the passive components as well as the connections between the first operational amplifier $OPA_1$ and the second operational amplifier $OPA_2$ may be adjusted in order to provide additional zeros and poles as desired, which may be any combination of complex and real. In general, the present disclosure contemplates the use of only two operational amplifiers to generate a second-order transfer function having two zeros, which may be any combination of complex and real. As discussed above, this is done by exploiting the differential nature of an input signal provided to the equalizer circuitry 20. Providing equalizer circuitry 20 in this manner allows for the creation of a transfer function with a desired complexity while maintaining simplicity and reducing both footprint and power consumption.

Figure 12:
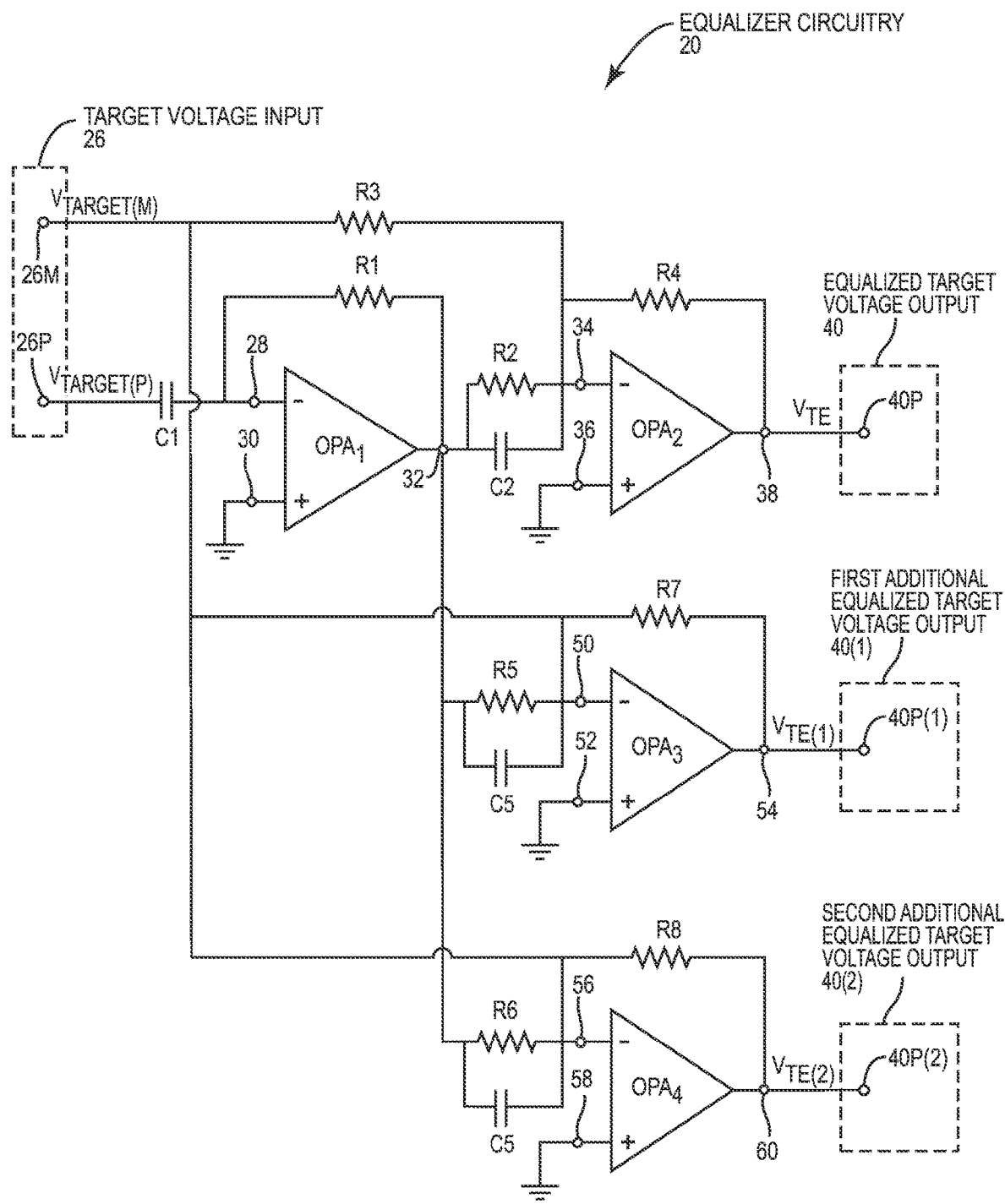
FIG. 12 is a diagram illustrating equalizer circuitry according to one embodiment of the present disclosure.

In some embodiments such as RF power amplifier systems for fifth generation (5G) millimeter wave (mmWave) applications, an ETIC may provide separate envelope tracking supply voltages to several RF power amplifiers simultaneously. Accordingly, it may be desirable for the equalizer circuitry 20 to simultaneously provide multiple equalized target voltage signals, each with a different transfer function, gain, or both. Accordingly, FIG. 12 shows the equalizer circuitry 20 according to an additional embodiment of the present disclosure. The equalizer circuitry 20 shown in FIG. 12 is substantially similar to that shown in FIG. 8, but further includes a third operational amplifier $OPA_3$ and a fourth operational amplifier $OPA_4$. The third operational amplifier $OPA_3$ includes a third inverting input node 50, a third non-inverting input node 52, and a third output node 54. The fourth operational amplifier $OPA_4$ includes a fourth inverting input node 56, a fourth non-inverting input node 58, and a fourth output node 60. The third inverting input node 50 is coupled to the first output node 32 via a fifth resistor R5 and a fifth capacitor C5, which are coupled in parallel with one another. The third inverting input node 50 is also coupled to the inverted target voltage input node 26M. The fourth inverting input node 56 is coupled to the first output node 32 via a sixth resistor R6 and a sixth capacitor C6, which are coupled in parallel with one another. The fourth inverting input node 56 is also coupled to the inverted target voltage input node 26M. The third non-inverting input node 52 is coupled to ground. The third output node 54 is coupled to the third inverting input node 50 via a seventh resistor R7. The fourth non-inverting input node 58 is coupled to ground. The fourth output node 60 is coupled to the fourth inverting input node 56 via an eighth resistor R8.

While only three stages are shown in the equalizer circuitry 20 in FIG. 12, those skilled in the art will readily appreciate that any number of operational amplifiers can be added in the same parallel fashion to create additional stages and thus independent outputs. In operation, the first operational amplifier $OPA_1$ and the second operational amplifier $OPA_2$ operate as described above to generate the equalized target voltage signal $V_{te}$ at the equalized target voltage output node 40P. The third operational amplifier $OPA_3$ operates similar to the second operational amplifier $OPA_2$ to generate a first additional equalized target voltage signal $V_{te(1)}$ at a first additional equalized target voltage output node 40P(1), which is part of a first additional equalized target voltage output 40(1). The values of the fifth resistor R5, the fifth capacitor C5, and the seventh resistor R7 will determine the transfer function between the target voltage input 26 and the first additional equalized target voltage output 40(1), which can be adjusted as necessary to create a desired response. Notably, the transfer function will similarly be a second-order complex-zero function. Similarly, the fourth operational amplifier $OPA_4$ generates a second additional equalized target voltage signal $V_{te(2)}$ at a second additional equalized target voltage output node 40P(2), which is part of a second additional equalized target voltage output 40(2). The values of the sixth resistor R6, the sixth capacitor C6, and the eighth resistor R8 will determine the transfer function between the target voltage input and the second additional equalized target voltage output 40(2), which can be adjusted as necessary to create a desired response. Again, the transfer function will be a second-order complex-zero function. Accordingly, the equalizer circuitry 20 can provide multiple equalized target voltage signals for multiple RF power amplifiers, which, as discussed, may be particularly useful in 5G mmWave applications.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. Equalizer circuitry comprising:
a differential target voltage input comprising a target voltage input node and an inverted target voltage input node;
an equalizer output; and
a first operational amplifier and a second operational amplifier coupled in series between the differential target voltage input and the equalizer output, wherein:
the first operational amplifier is configured to receive a target voltage signal from the target voltage input node and provide an intermediate signal based on the target voltage input signal;
the second operational amplifier is configured to receive the intermediate signal from the first operational amplifier and an inverted target voltage signal from the inverted target voltage input node and provide an output signal to the equalizer output;
the first operational amplifier and the second operational amplifier are interconnected with one or more passive components such that a transfer function between the differential target voltage input and the equalizer output is a second-order complex-zero function;
the first operational amplifier comprises a first inverting input node coupled to the target voltage input node, a first non-inverting input node coupled to ground, and a first output node, wherein the first operational amplifier is configured to receive the target voltage signal at the first inverting input node and provide the intermediate signal at the first output node; and
the second operational amplifier comprises a second inverting input node coupled to the first output node and the inverted target voltage input node, a second non-inverting input node coupled to ground, and a second output node coupled to the equalizer output, wherein the second operational amplifier is configured to receive the intermediate signal and the inverted target voltage signal at the second inverting input node and provide the output signal at the second output node;
wherein the equalizer circuitry further comprises:
a first resistor coupled in parallel with a first capacitor between the target voltage input node and the first inverting input node;
a second resistor coupled between the first inverted input node and the first output node;
a second capacitor coupled between the first output node and the second inverting input node;
a third resistor coupled between the inverted target voltage input node and the second inverted input node; and
a fourth resistor coupled between the second inverting input node and the second output node.

2. The equalizer circuitry of claim 1 further comprising a third capacitor coupled between the target voltage input node and the second inverting input node.

3. Equalizer circuitry comprising:
a differential target voltage input comprising a target voltage input node and an inverted target voltage input node;
an equalizer output; and
a first operational amplifier and a second operational amplifier coupled in series between the differential target voltage input and the equalizer output, wherein:
the first operational amplifier is configured to receive a target voltage signal from the target voltage input node and provide an intermediate signal based on the target voltage input signal;
the second operational amplifier is configured to receive the intermediate signal from the first operational amplifier and an inverted target voltage signal from the inverted target voltage input node and provide an output signal to the equalizer output;
the first operational amplifier and the second operational amplifier are interconnected with one or more passive components such that a transfer function between the differential target voltage input and the equalizer output is a second-order complex-zero function;
the first operational amplifier comprises a first inverting input node coupled to the target voltage input node, a first non-inverting input node coupled to ground, and a first output node, wherein the first operational amplifier is configured to receive the target voltage signal at the first inverting input node and provide the intermediate signal at the first output node; and
the second operational amplifier comprises a second inverting input node coupled to the first output node and the inverted target voltage input node, a second non-inverting input node coupled to ground, and a second output node coupled to the equalizer output, wherein the second operational amplifier is configured to receive the intermediate signal and the inverted target voltage signal at the second inverting input node and provide the output signal at the second output node;

wherein the equalizer circuitry further comprises:
a first capacitor coupled between the target voltage input node and the first inverting input node;
a first resistor coupled between the first inverting input node and the first output node;
a second resistor coupled in parallel with a second capacitor between the first output node and the second inverting input node;
a third resistor coupled between the inverted target voltage input node and the second inverting input node; and
a fourth resistor coupled between the second inverting input node and the second output node.

4. The equalizer circuitry of claim 1 wherein Equalizer circuitry comprising:
a differential target voltage input comprising a target voltage input node and an inverted target voltage input node;
an equalizer output; and
a first operational amplifier and a second operational amplifier coupled in series between the differential target voltage input and the equalizer output, wherein:
the first operational amplifier is configured to receive a target voltage signal from the target voltage input node and provide an intermediate signal based on the target voltage input signal;
the second operational amplifier is configured to receive the intermediate signal from the first operational amplifier and an inverted target voltage signal from the inverted target voltage input node and provide an output signal to the equalizer output;
the first operational amplifier and the second operational amplifier are interconnected with one or more passive components such that a transfer function between the differential target voltage input and the equalizer output is a second-order complex-zero function;
the first operational amplifier comprises a first inverting input node, a first non-inverting input node coupled to the target voltage input node, and a first output node coupled to the first inverting input node, wherein the first operational amplifier is configured to receive the target voltage signal at the first non-inverting input node and provide the intermediate signal at the first output node; and
the second operational amplifier comprises a second inverting input node coupled to the first output node, a second non-inverting input node coupled to ground, and a second output node coupled to the equalizer output, wherein the second operational amplifier is configured to receive the intermediate signal and the inverted target voltage signal at the second inverting input node and provide the output signal at the second output node.

5. The equalizer circuitry of claim 4 further comprising:
a first capacitor coupled between the target voltage input node and the first non-inverting input node;
a first resistor coupled between the first non-inverting input node and ground;
a second capacitor coupled in parallel with a second resistor between the first output node and the second inverting input node;
a third capacitor coupled in series with a third resistor between the inverted target voltage input node and the second inverting input node;
a fourth resistor coupled between the target voltage input node and the second inverting input node; and
a fifth resistor coupled between the second inverting input node and the second output node.

6. The equalizer circuitry of claim 5 further comprising:
a sixth resistor coupled between the first inverting input node and the first output node; and
a seventh resistor coupled between the first inverting input node and ground.

7. Equalizer circuitry comprising:
a differential target voltage input comprising a target voltage input node and an inverted target voltage input node;
an equalizer output; and
a first operational amplifier and a second operational amplifier coupled in series between the differential target voltage input and the equalizer output, wherein:
the first operational amplifier is configured to receive a target voltage signal from the target voltage input node and provide an intermediate signal based on the target voltage input signal;
the second operational amplifier is configured to receive the intermediate signal from the first operational amplifier and an inverted target voltage signal from the inverted target voltage input node and provide an output signal to the equalizer output;
the first operational amplifier and the second operational amplifier are interconnected with one or more passive components such that a transfer function between the differential target voltage input and the equalizer output is a second-order complex-zero function; and
the equalizer output is a differential equalizer output comprising an equalized target voltage output node and an inverted equalized target voltage output node.

8. The equalizer circuitry of claim 7 wherein:
the first operational amplifier comprises a first non-inverting input node coupled to the target voltage input node, a first inverting input node coupled to the inverted target voltage input node, a first inverting output node, and a first non-inverting output node; and
the second operational amplifier comprises a second non-inverting input node coupled to the first inverting output node and the inverted target voltage input node, a second inverting input node coupled to the first non-inverting output node and the target voltage input node, a second inverting output node coupled to the inverted equalized target voltage output node, and a second non-inverting output node coupled to the equalized target voltage output node.

9. The equalizer circuitry of claim 8 further comprising:
a first resistor coupled in parallel with a first capacitor between the inverted target voltage input node and the second non-inverting input node;
a second resistor coupled in parallel with a second capacitor between the second non-inverting input node and the second inverting output node;
an intermediate capacitor coupled between the first inverting output node and the second non-inverting input node;

a third resistor coupled in parallel with a third capacitor between the first non-inverting input node and the first inverting output node;
a fourth resistor coupled in series with a DC blocking capacitor, the combination of which is in turn coupled in parallel with a fourth capacitor, between the target voltage input node and the first non-inverting input node;
a first additional resistor coupled in parallel with a first additional capacitor between the target voltage input node and the second inverting input node;
a second additional resistor coupled in parallel with a second additional capacitor between the second inverting input node and the second non-inverting output node;
an additional intermediate capacitor coupled between the first non-inverting output node and the second inverting input node;
a third additional resistor coupled in parallel with a third additional capacitor between the first inverting input node and the first non-inverting output node; and
a fourth additional resistor coupled in series with an additional DC blocking capacitor, the combination of which is in turn coupled in parallel with a fourth additional capacitor, between the inverted target voltage input node and the first inverting input node.

10. Equalizer circuitry comprising:
a differential target voltage input comprising a target voltage input node and an inverted target voltage input node;
an equalizer output;
an additional equalizer output;
a first operational amplifier and a second operational amplifier coupled in series between the differential target voltage input and the equalizer output, and
a third operational amplifier coupled between an output of the first operational amplifier and the additional equalizer output, wherein:
the first operational amplifier is configured to receive a target voltage signal from the target voltage input node and provide an intermediate signal based on the target voltage input signal;
the second operational amplifier is configured to receive the intermediate signal from the first operational amplifier and an inverted target voltage signal from the inverted target voltage input node and provide an output signal to the equalizer output;
the first operational amplifier and the second operational amplifier are interconnected with one or more passive components such that a transfer function between the differential target voltage input and the equalizer output is a second-order complex-zero function;
the third operational amplifier is configured to receive the intermediate signal and the inverted target voltage signal and provide an additional output signal to the additional equalizer output node; and
a transfer function between the differential target voltage input and the additional equalizer output is a second order complex zero function and is different from the transfer function between the differential target voltage input and the equalizer output.

11. An envelope tracking integrated circuitry (ETIC) comprising:
equalizer circuitry comprising a first operational amplifier and a second operational amplifier coupled in series, wherein:

the first operational amplifier is configured to receive a target voltage signal and provide an intermediate signal based on the target voltage input signal;
the second operational amplifier is configured to receive the intermediate signal and an inverted target voltage input signal and provide an equalized output signal; and
the first operational amplifier and the second operational amplifier are interconnected with one or more passive components such that a transfer function between an input of the first operational amplifier and an output of the second operational amplifier is a second-order complex-zero function;
signal processing circuitry coupled to the equalizer circuitry and configured to process the equalized output signal to provide a processed equalized output signal; and
parallel amplifier circuitry coupled to the signal processing circuitry and configured to modulate a battery voltage based on the processed equalized output signal to provide an envelope tracking power supply signal.

12. The ETIC of claim 11 wherein:
the first operational amplifier comprises a first inverting input node coupled to the target voltage input node, a first non-inverting input node coupled to ground, and a first output node, wherein the first operational amplifier is configured to receive the target voltage signal at the first inverting input node and provide the intermediate signal at the first output node; and
the second operational amplifier comprises a second inverting input node coupled to the first output node and the inverted target voltage input node, a second non-inverting input node coupled to ground, and a second output node coupled to the equalizer output, wherein the second operational amplifier is configured to receive the intermediate signal and the inverted target voltage signal at the second inverting input node and provide the output signal at the second output node.

13. The ETIC of claim 12 further comprising:
a first resistor coupled in parallel with a first capacitor between the target voltage input node and the first inverting input node;
a second resistor coupled between the first inverted input node and the first output node;
a second capacitor coupled between the first output node and the second inverting input node;
a third resistor coupled between the inverted target voltage input node and the second inverted input node; and
a fourth resistor coupled between the second inverting input node and the second output node.

14. The ETIC of claim 13 further comprising a third capacitor coupled between the target voltage input node and the second inverting input node.

15. The ETIC of claim 12 further comprising:
a first capacitor coupled between the target voltage input node and the first inverting input node;
a first resistor coupled between the first inverting input node and the first output node;
a second resistor coupled in parallel with a second capacitor between the first output node and the second inverting input node;
a third resistor coupled between the inverted target voltage input node and the second inverting input node; and
a fourth resistor coupled between the second inverting input node and the second output node.

16. The ETIC of claim 11 wherein:
the first operational amplifier comprises a first inverting input node, a first non-inverting input node coupled to the target voltage input node, and a first output node coupled to the first inverting input node, wherein the first operational amplifier is configured to receive the target voltage signal at the first non-inverting input node and provide the intermediate signal at the first output node; and
the second operational amplifier comprises a second inverting input node coupled to the first output node, a second non-inverting input node coupled to ground, and a second output node coupled to the equalizer output, wherein the second operational amplifier is configured to receive the intermediate signal and the inverted target voltage signal at the second inverting input node and provide the output signal at the second output node.

17. The ETIC of claim 16 further comprising:
a first capacitor coupled between the target voltage input node and the first non-inverting input node;
a first resistor coupled between the first non-inverting input node and ground;
a second capacitor coupled in parallel with a second resistor between the first output node and the second inverting input node;
a third capacitor coupled in series with a third resistor between the inverted target voltage input node and the second inverting input node;
a fourth resistor coupled between the target voltage input node and the second inverting input node; and
a fifth resistor coupled between the second inverting input node and the second output node.

18. The ETIC of claim 17 further comprising:
a sixth resistor coupled between the first inverting input node and the first output node; and
a seventh resistor coupled between the first inverting input node and ground.

19. The ETIC of claim 11 wherein:
the equalizer output is a differential equalizer output comprising an equalized target voltage output node and an inverted equalized target voltage output node;
the first operational amplifier comprises a first non-inverting input node coupled to the target voltage input node, a first inverting input node coupled to the inverted target voltage input node, a first inverting output node, and a first non-inverting output node;
the second operational amplifier comprises a second non-inverting input node coupled to the first inverting output node and the inverted target voltage input node, a second inverting input node coupled to the first non-inverting output node and the target voltage input node, a second inverting output node coupled to the inverted equalized target voltage output node, and a second non-inverting output node coupled to the equalized target voltage output node; and
the equalizer circuitry further comprises:
a first resistor coupled in parallel with a first capacitor between the inverted target voltage input node and the second non-inverting input node;
a second resistor coupled in parallel with a second capacitor between the second non-inverting input node and the second inverting output node;
an intermediate capacitor coupled between the first inverting output node and the second non-inverting input node;
a third resistor coupled in parallel with a third capacitor between the first non-inverting input node and the first inverting output node;
a fourth resistor coupled in series with a DC blocking capacitor, the combination of which are in turn coupled in parallel with a fourth capacitor, between the target voltage input node and the first non-inverting input node;
a first additional resistor coupled in parallel with a first additional capacitor between the target voltage input node and the second inverting input node;
a second additional resistor coupled in parallel with a second additional capacitor between the second inverting input node and the second non-inverting output node;
an additional intermediate capacitor coupled between the first non-inverting output node and the second inverting input node;
a third additional resistor coupled in parallel with a third additional capacitor between the first inverting input node and the first non-inverting output node; and
a fourth additional resistor coupled in series with an additional DC blocking capacitor, the combination of which are in turn coupled in parallel with a fourth additional capacitor, between the inverted target voltage input node and the first inverting input node.

* * * * *

UNITED STATES PATENT AND TRADEMARK OFFICE
CERTIFICATE OF CORRECTION

PATENT NO. : 11,671,064 B2
APPLICATION NO. : 17/142350
DATED : June 6, 2023
INVENTOR(S) : Nadim Khlat, Michael R. Kay and James M. Retz It is certified that error appears in the above-identified patent and that said Letters Patent is hereby corrected as shown below:

In the Claims

In Column 15, Lines 21 and 22, replace "4. The equalizer circuitry of claim 1 wherein Equalizer circuitry comprising:" with --4. Equalizer circuitry comprising:--.

Signed and Sealed this
Eleventh Day of July, 2023

Katherine Kelly Vidal
*Director of the United States Patent and Trademark Office*